United States Patent [19]

Coleman

[11] 3,728,593

[45] Apr. 17, 1973

[54] ELECTRO OPTICAL DEVICE COMPRISING A UNITARY PHOTOEMITTING JUNCTION AND A PHOTOSENSITIVE BODY PORTION HAVING HIGHLY DOPED SEMICONDUCTOR ELECTRODES

[75] Inventor: Michael G. Coleman, Tempe, Ariz.

[73] Assignee: Motorola, Inc., Franklin Park, Ill.

[22] Filed: Oct. 6, 1971

[21] Appl. No.: 186,884

[52] U.S. Cl.....317/235 R, 317/235 N, 317/235 AD, 317/234 L

[51] Int. Cl...........................H01l 11/00, H01l 15/00

[58] Field of Search........................317/234, 235, 27, 317/43, 5.4, 5.3

[56] References Cited

UNITED STATES PATENTS

| | | | |
|---|---|---|---|
| 3,043,959 | 7/1962 | Diemer | 317/235 |
| 3,159,780 | 12/1964 | Parks | 317/235 |
| 3,465,159 | 9/1969 | Stern | 317/235 |
| 3,478,215 | 11/1969 | Winstel et al. | 317/235 |
| 3,532,945 | 10/1970 | Weckler | 317/235 |
| 3,219,891 | 11/1965 | Benedict | 317/235 |

*Primary Examiner*—John W. Huckert
*Assistant Examiner*—Andrew J. James
*Attorney*—Vincent Rauner et al.

[57] ABSTRACT

There is disclosed an electro optical device comprising a single body of semi insulating semiconductor material having a semi insulating semiconductivity of approximately $10^8$ ohm-centimeters, preferably gallium arsenide. Gallium arsenide in this conductivity range exhibits a photo conductivity characteristic in which there is a relatively linear variance of resistivity with impinging photons. A PN junction is formed in one portion of the substrate and, responsive to electric signals applied across the junction, emits photons affecting the resistivity of the semi insulating layer. Contact to the photo resistive layer can be connected in a circuit as either a switch or a variable resistor, depending upon the level of signals applied across the PN junction.

5 Claims, 1 Drawing Figure

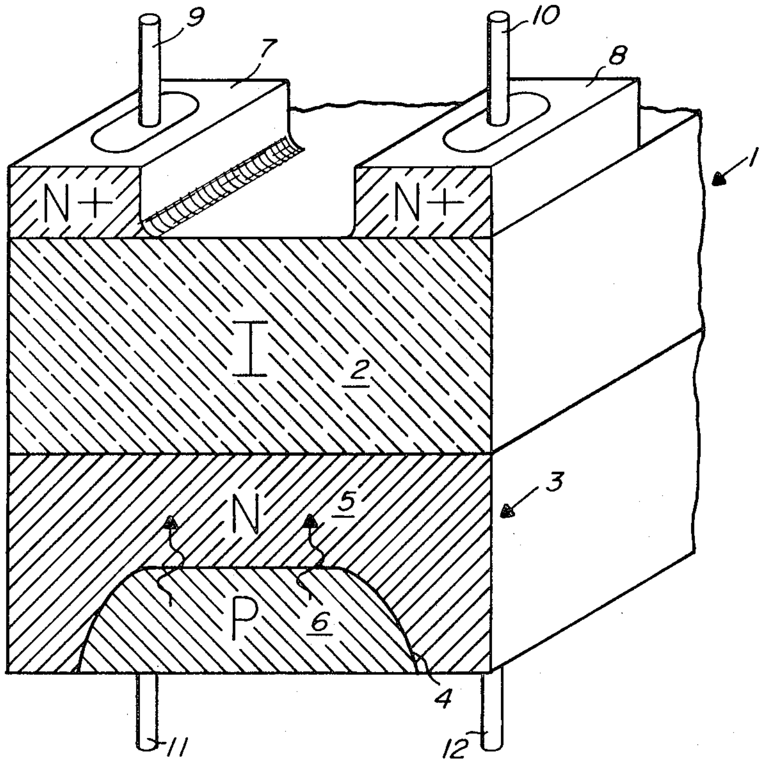
9
10
7
8
1
N+
N+
I
2
N
5
3
P
6
4
11
12

ELECTRO OPTICAL DEVICE COMPRISING A UNITARY PHOTOEMITTING JUNCTION AND A PHOTOSENSITIVE BODY PORTION HAVING HIGHLY DOPED SEMICONDUCTOR ELECTRODES

BACKGROUND OF THE INVENTION

This invention relates to semiconductor control devices and more particularly to opto electronic semiconductor control devices.

More particularly, this invention relates to a circuit element comprising a light emitting PN junction connected with a photo conductive semiconductor body forming an integral switch or amplifier unit. Circuit elements of this type have the advantage of very rapid speed and would be extremely advantageous if economically and reproducibly manufactured. While such units have been suggested in the past, for this purpose, such units have suffered from the defects of requiring too many processing steps or have not truly been integrally formed.

It is an object of this invention to provide an opto electronic switching or amplifying unit which is relatively simple to produce and reliably operate.

It is a further object of this invention to provide an electro optical semiconductor unit which reacts rapidly to changes in inputs.

SUMMARY OF THE INVENTION

In accordance with the aforementioned objects of the invention, there is provided a highly sensitive, rapidly operating opto electronic semiconductor unit which comprises a body of semi insulating semiconductor gallium arsenide on which an epitaxial layer of N-type gallium arsenide is formed. A PN junction is formed in the N-type epitaxial layer to form a light emitting PN junction on one side of the semi insulating material. To the other side of the semi insulating semiconductor body is formed a pair of highly doped N+ conductivity semiconductor contacts forming the output for the device.

THE DRAWINGS

Further objects and advantages of the invention will be apparent from the following complete description thereof and from the drawing wherein:

THE FIGURE is a cross section view of an opto electronic semiconductor device in accordance with the preferred embodiment of the invention.

DETAILED DESCRIPTION

The FIGURE shows schematically a cross sectional view of the opto electronic semiconductor device 1 which comprises a monocrystalline semi insulating gallium arsenide body 2 doped with chromium to have a semi insulating semiconductivity of approximately $10^6$–$10^8$ ohm-centimeters. Formed integrally on one side of the body is a photo emitting diode portion 3 which comprises a photo emitting PN junction, or diode, 4 formed by an epitaxial layer 5 of gallium arsenide of N-conductivity and a P-conductivity region 6 diffused therein.

On a side of the semi insulating semiconductor body 2 opposite from that of the photo emitting diode portion 3 is formed a pair of contact members 7 and 8. The contact members 7 and 8 are of N+ conductivity gallium arsenide so as to assure that good ohmic contact with the intrinsic body 2 while minimizing the series resistance with the photo sensitive body 2. Output electrodes 9 and 10 are ohmically connected to the N+ conductivity regions for connecting the device to an external circuit means. Similarly electrodes 11 and 12 form input connections to the N-conductivity region 5 and to the P-conductivity region 6 for connecting an input signal across the PN junction 4.

Thus, in operation, an input signal connected to the electrodes 11 and 12 cause photons to be emitted from the PN junction 4 to affect the conductivity of the semi insulating region 2, to effect a signal across the electrodes 9 and 10. Depending on the characteristic of the input signal, the affect of semi insulating region as exhibited across electrodes 9 and 10 may be a great increase in conductivity to effect a switching function or merely a linear decrease in resistivity to effect an amplification function.

In the use of this element for an operating circuit as a bi-stable element, an electric signal source may be connected in series with the electrodes so that the PN junction is biased in a forward direction, thereby emitting photons to the photo resistive element. The output circuit may contain a load such as a relay for operating a particular circuit. By an increase to the voltage across the PN junction, the resistivity of the semi insulating material will drop sharply, increasing current through, for example, the relay, to close it to operate a circuit. On the other hand, the photo conductive element might be a part of a voltage divider circuit, thus decreasing current through a load as the resistivity of the semi insulating semiconductor material increases.

It will be obvious that the device could be used as a photo sensitive memory element, if the electrodes from the semi insulating photo sensitive unit were connected to the electrodes of the PN junction. Thus, a light excitation of that photo sensitive end would increase current through the PN junction causing a photon increase, which would latch the device into an ON condition. The memory of the element could be reset by interrupting the voltage bias to the PN junction.

In another mode of operation current from the PN junction through, for example electrode 10 could be modified by placing a bias on electrode 9. In this mode the bias on electrode gives a field-effect transistor effect to the semi insulating layer.

The device as shown may be manufactured reproducibly in several processes, however, it is preferred to place an epitaxial layer of N-type gallium arsenide onto a body of semi insulating semiconductor body 2. Then the PN junction is formed in the epitaxial layer and another epitaxial layer of the N+ conductivity material is deposited on the opposite side of the body of semi insulating material. The layer of N+ material may then be etched to isolate two areas to form the two conductor regions 7 and 8. Alternatively, the N+ region could be formed separately by selective epitaxial techniques. It is further recognized that the PN junction might be formed by a double epitaxial process wherein first an epitaxial layer of N-conductivity gallium arsenide is deposited, and then a layer of P-type gallium arsenide. On the other hand, the semi insulating layer may be epitaxially deposited on an N-conductivity substrate and then the N+ contacts and the P-diffusion made.

While the invention has been disclosed by way of the preferred embodiment thereof, it will be obvious to one skilled in the art that suitable modifications may be made therein without departing from the spirit and scope of the invention.

What is claimed is:

1. A semiconductor device comprising a radiation responsive photo sensitive intrinsic semiconductive body portion, a photo emitting PN junction formed in contact with said body portion thereof, highly doped semiconductor electrode portions integral with said intrinsic semiconductive body at a portion spaced from the PN junction and electrical connections made to said highly doped semiconductor electrode portions.

2. A semiconductor device as set forth in claim 1 wherein said photo sensitive body is a semi-insulating gallium arsenide body having a conductivity of approximately $10^8$ ohm-centimeters.

3. A semiconductor device as recited in claim 2 wherein said gallium arsenide body is doped with chromium.

4. A semiconductor device as recited in claim 1 and further including electrodes connected to the PN junction on a side of the body portion opposite to the highly doped semiconductor electrodes.

5. A semiconductor unit as recited in claim 1 wherein said PN junction is formed in an epitaxial layer on one side of said body portion.

* * * * *